United States Patent [19]

Garrett

[11] 3,725,752

[45] Apr. 3, 1973

[54] SEMICONDUCTOR DEVICE

[75] Inventor: John Mansell Garrett, London, England

[73] Assignee: Westinghouse Brake and Signal Company Limited, London, England

[22] Filed: Sept. 15, 1971

[21] Appl. No.: 180,631

[30] Foreign Application Priority Data

Oct. 6, 1970 Great Britain.....................47,432/70

[52] U.S. Cl......317/235 R, 317/235 D, 317/235 AB, 317/235 AE

[51] Int. Cl................................................H01q 5/00

[58] Field of Search.......................317/853, 584, 844

[56] References Cited

UNITED STATES PATENTS 3,590,339 1/1970 Bilo et al.............................317/235

*Primary Examiner*—John W. Huckert
*Assistant Examiner*—E. Wojciechowicz
*Attorney*—F. Shapoe et al.

[57] ABSTRACT

The present disclosure provides a semiconductor device having a first portion which constitutes effectively a transistor and a second portion which constitutes effectively a thyristor; the collector region of the transistor and the anode region of the thyristor being commonly connected to a first lead of the device, the emitter region of the transistor being connected to a second lead of the device, the gated base region of the thyristor being connected to a third lead of the device, and the base region of the transistor portion and the cathode region of the thyristor being commonly connected to a fourth lead of the device.

1 Claim, 6 Drawing Figures

SEMICONDUCTOR DEVICE

BACKGROUND OF THE INVENTION

Field of the Invention

The present invention is in the field of semi-conductor devices.

SUMMARY OF THE INVENTION

The present invention comprises a semiconductor device comprising a first portion which constitutes a transistor and a second portion which constitutes a thyristor; the collector region of the transistor and the anode region of the thyristor being commonly connected to a first lead external of the element, the emitter region of the transistor being connected to a second lead external of the element, the gate region of the thyristor being connected to a third lead external of the element, and the base region of the transistor and the cathode region of the thyristor being commonly connected to a fourth lead external of the element.

DESCRIPTION OF THE DRAWINGS

For a better understanding of the nature of this invention, reference should be had to the following detailed description and drawings in which.

Figure 1:
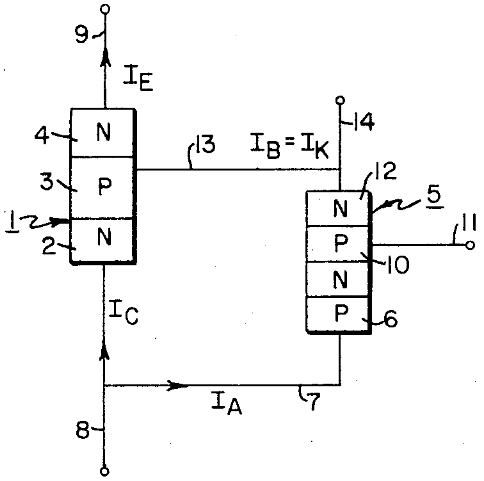
FIG. 1 is a schematic diagram of the semiconductor device of this invention.

The present invention provides a semiconductor device having a first portion which constitutes a transistor and a second portion which constitutes a thyristor. The collector region of the transistor and the anode region of the thyristor portion are commonly connected to a first lead external of the element. The emitter region of the transistor is connected to a second lead external of the element. The gate region of the thyristor is connected to a third lead external of the element, and the base region of the transistor and the cathode region of the thyristor are commonly connected to a fourth lead external of the element.

The first portion may constitute effectively a N-P-N transistor and the second portion may constitute effectively a P-N-P-N thyristor.

Preferably in operation, the second and third leads of the device are connected to a signal generator whereby a signal is applied across the second and third leads, which signal as applied to the third lead is positive with respect to the second lead. The third and fourth leads are connected to a second signal generator whereby a signal is applied across the third and fourth leads which signal as applied to the fourth lead is positive with respect to the third lead.

The signals may be generated from a common signal generator having a pair of outputs, one of which is connected to the fourth lead and the other of which is commonly connected to both the second and third leads, and there is included in that part of the electrical circuit including the other of the outputs, the second lead and the emitter region of the transistor portion, a diode so arranged as to block the flow of current from said other of the outputs of the common generator to the second lead.

In such an arrangement, the diode may be constituted by a third portion of the semiconductor device. One of the pair of outputs of the common signal generator may be connected to both the second and the fourth leads, there being interposed between the generator and the second lead a diode so arranged as to block flow of current from said one of the outputs to the second lead and there being interposed between the generator and the fourth lead a diode so arranged as to block flow of current from the fourth lead to the generator.

The device may have opposed surfaces from one of which extends inwardly both a P-region and an N-region, by which surface the device is mounted on a base of electrically-conductive material which provides the common connection to the first lead; the N-region interfacing with a second P-region extending inwardly of the device from the other of the opposed surface and within which lie additional N-regions also extending inwardly of the device from said other of the opposed surfaces, to one of which additional N-regions is connected the second lead, and to another of which regions is connected the fourth lead; the fourth lead also being connected to said second P-region as is also the third lead.

The additional N-regions may be circular in plan view and concentric one with the other, the second lead being connected to the outer of the additional N-regions.

When a diode is provided as above described, which is constituted by a third portion of the semiconductor device, there may be provided lying within the second P-region and extending inwardly of the element from said other of the opposed surfaces, a further N-region which together with the second P-region constitutes that diode.

More specifically, and referring to the construction diagrammatically shown in FIG. 1, the construction comprising a transistor 1 of N-P-N configuration having a collector region 2, a base region 3, and an emitter region 4. Also included in the arrangement is a thyristor 5 of P-N-P-N construction of which the anode region 6 is commonly connected by connection 7 to a first lead 8.

The emitter region 4 of the transistor 1 is connected to a second lead 9 and the gate region 10 of the thyristor 5 is connected to a third lead 11. The base region 3 of the transistor portion and the cathode region 12 of the thyristor is commonly connected by a connection 13 to a fourth lead 14.

The device described above is operated by, as shown in FIG. 2, the device 15, comprised of the transistor 1 and the thyristor 5, by connecting across the second and fourth leads 9 and 14 a signal generator 16 by which a "turn-off" signal can be applied across those leads with the signal as applied to the third lead 14 being positive with respect to the signal as applied to the second lead 9.

There is also provided a second signal generator 7 by which 5 a "turn-on" signal can be applied across the third and fourth leads 11 and 14 respectively with the signal as applied to the third lead 11 being positive with respect to the signal as applied to the fourth lead 14.

With a potential applied across the first and second leads 8 and 9 respectively with the lead 8 positive with respect to the lead 9, the device 15 is in its blocking state.

If now a "turn-on" signal is applied from the signal generator 17, the third lead 11 will become positive with respect to the fourth lead 14 to cause the cathode region 12 to inject carriers, thus permitting the thyristor 5 to go into conduction in the normal way. Such "triggering" of the thyristor 5 will cause the cathode current in the thyristor 5 to become the base current in the base region 3 of the transistor 1. The transistor 1 will then be caused to carry a collector current which will be greater than the thyristor cathode current by a factor equal to its common emitter current gain ($\beta$).

$$I_C=\beta I_K$$

and total current, $$I_E=I_C+I_K$$
$$=(l+\beta)\,I_K$$

While, as above described, the positive signal applied to the third lead 11 is returned via the fourth lead 14, it could, instead, be returned via the second lead 9. In this case, the thyristor "turn-on" signal passes also through the emitter 4 / base 3 P-N junction of the transistor 1.

In equilibrium, the collector-base voltage of the transistor 1 is equal to the anode-voltage of the thyristor 5 and the thyristor 5 and the transistor 1 are not, therefore, quite in saturation.

To "turn-off" the whole device 15, it is neces-sary only to quench the conduction of the thyristor 5. Since the thyristor 5 carries only a fraction ($I_K/I_E=1/1+\beta$ ) of the total device 15 current, this is relatively easy as compared with a pure thyristor device.

To "turn-off" the device 15 a "turn-off" signal is applied from the signal generator 16 across the second and fourth leads 9 and 14 respectively, the "turn-off" signal applied being such that the fourth lead 14 is rendered positive with respect to the second lead 9. To achieve "turn-off" the applied signal should be of greater magnitude than the previously-flowing thyristor current. By the application of this "turn-off" signal, the transistor 5 is driven further towards saturation with a consequent fall in its collector-base voltage to a value below that required to sustain the thyristor 5 in a state of conduction. The applied signal needs to be applied only long enough to permit the thyristor to regain its blocking state, after which the signal may be removed.

Cessation of conduction by the thyristor inevitably causes the transistor also to cease to conduct.

The thyristor 5 will be assisted in regaining its blocking state if the third lead 11 is held negative with respect to the fourth lead 14 as in normal gate "turn-off."

Figures 2, 3:
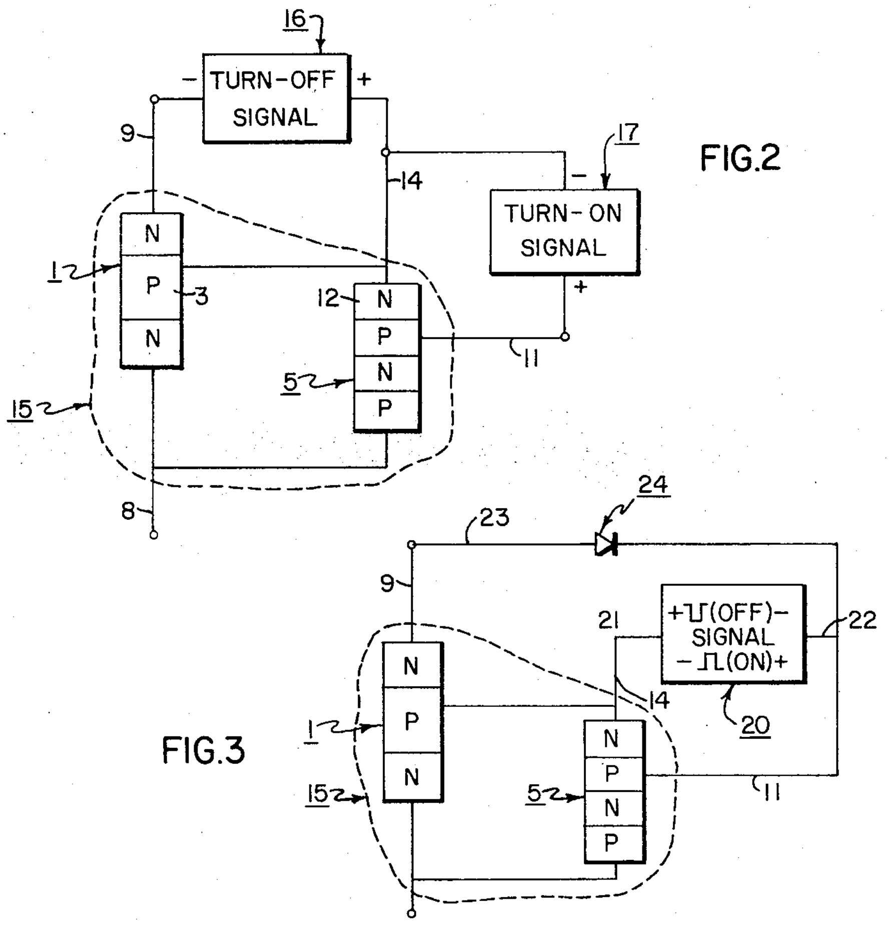
FIG. 2 is a schematic diagram of the semiconductor device of this invention connected in a circuit relationship with signal generators.
FIG. 3 is a schematic diagram of the semiconductor device of this invention connected in a circuit relationship with a single signal generator.

Such a situation can be achieved with the circuit of FIG. 3. In the FIG. 3 circuit, the signal generator 16 and 17 are combined into a single generator 20 capable of producing both a "turn-off" and a "turn-on" signal. The generator 20 has two outputs 21 and 22 of which the output 21 is connected to the fourth lead 14 and the output 22 is connected both to the third lead 11 and the second lead 9 through a connection 23 including a diode 24 so arranged as to block the flow of current from output 22 of the generator 20 to the second lead 9. By this arrangement, when the generator 20 generates a "turn-off" signal, not only will the fourth lead 14 be rendered positive with respect to the second lead 9, but the third lead 11 will be rendered negative with respect to the fourth lead 14.

In an alternative arrangement, the connection 23 and the included diode 24 may be omitted so that switching of the total device 15 is effected merely by switching (either off or on by means of the signal generator 20) the thyristor portion 15. The thyristor portion 15 then acts as a conventional gate turn-off switch.

Figure 4:
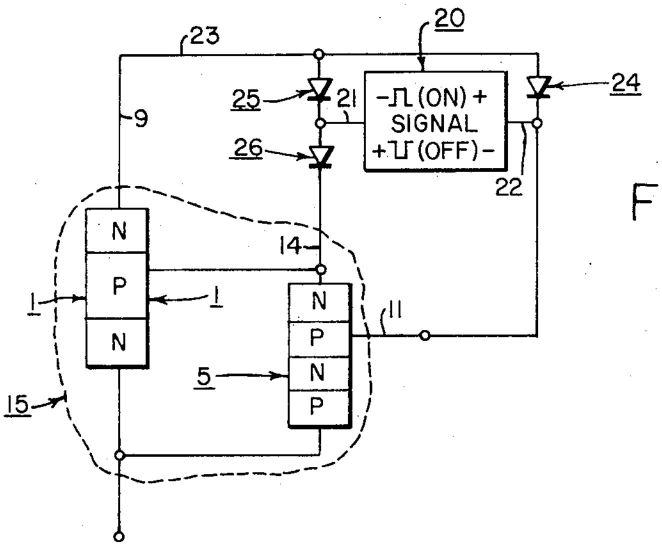
FIG. 4 is a modified form of the diagram of FIG. 3.

In FIG. 4 is shown a further sophistication of the circuit shown in FIG. 3 in which the output 21 of the signal generator 20 is connected between a pair of diodes 25 and 26, of which the diode 25 is connected between the output 21 of the generator 20 and the second lead 9, so arranged as to block the flow of current from the output 21 to the lead 9, and the diode 26 being so arranged as to block the flow of current from the fourth lead 14 to the output 21 of the generator 20.

The circuit arrangement of FIGS. 3 and 4 has the advantage over the circuit arrangement of FIG. 2 in that the "turn-on" and "turn-off" signals are injected between the same points in the circuit, and therefore, a single generator 20 giving alternate positive and negative output signals can be used to drive the device 15.

Figure 5:
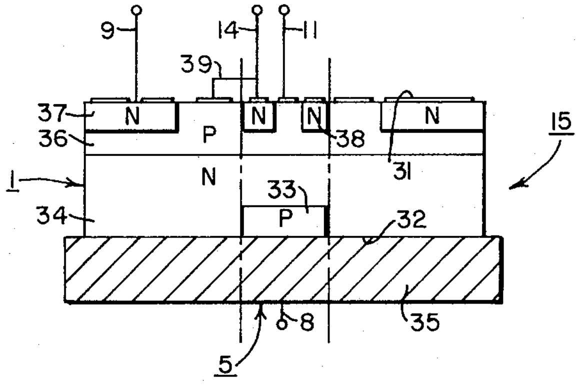
FIG. 5 is a side view, partially in section, of the device of this invention.

FIG. 5 shows a cross-sectional view of a device 15 usable in any one of the embodiments shown in FIGS. 1 to 4.

The device 15 shown in FIG. 5 is of concentric arrangement of which the outer portion beyond the chain-lines constitutes the transistor 1, and the central portion within the chain-lines constitutes the thyristor 5.

The device has opposed surfaces 31 and 32. Extending inwardly of the surface is a P-region 33 which constitutes the anode region 6 of the thyristor portion 5, and a N-type region 34, the part of which lying externally of the chain-lines constitutes the collector region of the transistor 1, and the interior portion of which lying within the chain-lines and above the P-region 33 constitutes the next successive N-region of the thyristor 5. The device is mounted by its surface 32 on an electrically-conductive base 35 which constitutes the means by which the collector region 2 of the transistor portion 1 and the anode region 6 of the thyristor 5 is commonly connected to the first lead 8.

Interfacing with the P-region is a further P-region 36 extending inwardly of the device 15 from the surface 31. The part of the P-region 36 lying externally of the chain-lines constitutes the base region 3 of the transistor portion 1, and the part of the P-region 36 lying internally of the chain-lines constitutes the gate region 10 of the thyristor portion 5.

Formed within the P-region 36 and extending inwardly of the device 15 from the surface 31 thereof are two additional circular concentric N-regions 37 and 38. The outer 37 of the concentric N-regions constitutes the emitter of the transistor portion 1 and to this N-region 37 is connected the second lead 9. The inner 38 concentric N-region constitutes the cathode region 12 of the thyristor portion 5, and has connected to it the fourth lead 14, which is shorted to the P-region 36 by means of a shorting link 39 which is connected to the P-region 36 in that part thereof which forms the base region 3 of the transistor 1. In the center is the third lead 11 which constitutes the gate lead and is connected to that part of the P-region 36 which constitutes the gate region of the thyristor portion 5.

It will be seen that both the N-region 34 and the P-region 36 are common to both the transistor portion 1 and the thyristor portion 5. The lateral conductivity, however, of these two regions 34 and 36 is low enough to be ignored in relation to the conductivity of the external leads.

The shorting link 39 may be made sufficiently resistive as to limit the "turn-on" surge of current in the thyristor portion 5 if this is found to be desirable.

In the above described arrangement, the N-region 37 may not be of annular configuration, but may, and indeed, may desirably be, of a configuration having radially inwardly projecting finger-like portions interdigitated with complementary-shaped finger-like portions of that part of the P-region 36 which constitutes the base region 3 of the transistor portion 1 of the total device. With such a modification the ohmic contact to the P-region 36 would have a similar outer peripheral configuration as that of the finger-like portions of said part of the P-region 36. Thus, the lateral resistance through the P-region 36 would be equal throughout that part thereof constituting the base region 3 of the transistor portion 1.

Figure 6:
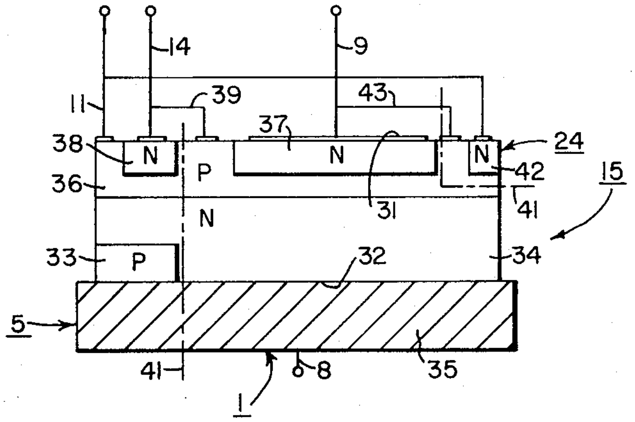
FIG. 6 is a side view, partially in section, of a modified form of the device of this invention.

Turning to FIG. 6, there is here shown the device 15 with the diode 24 of FIG. 3 incorporated in the device.

In this case, the construction is not of a concentric form, but the thyristor 5 is on the left-hand side (as viewed in the drawing) of the chain-line 41, and the remainder of the device constitutes the transistor 1.

The diode 24 is formed by a further N-region 42 lying within the P-region 36 and extending inwardly of the device 15 from the surface 31; the diode 24 being provided by the N-region 42 and the part of the P-region 36 lying to the left of and above (as viewed in the drawing) the chain-line 41.

The resistance of the P-region 36 would be too high to give rise to any significant shorting effect between the fourth lead 14 and the second lead 9 through the shorting link 39 and the shorting link 43 corresponding to the connection 23 of FIG. 3.

What we claim is:

1. A semiconductor device comprising; (1) a first portion which constitutes a transistor, (2) a second portion which constitutes a thyristor and (3) a third portion which constitutes a diode, (4) the collector region of the transistor portion and the anode of the thyristor portion being commonly connected to a first lead external of the device, (5) the emitter region of the transistor portion being connected to a second lead external of the device, (6) the gate region of the thyristor portion being connected to a third lead external of the device, (7) the base region of the transistor portion and the cathode region of the thyristor portion being commonly connected to a fourth lead external of the device, and (8) one region of the diode being common to the base region of the transistor and connected externally of the device to the emitter of the transistor and the other region of the diode being connected externally of the device to the gate region of the thyristor.

* * * * *